United States Patent
Ushikubo et al.

(10) Patent No.: US 10,840,859 B2
(45) Date of Patent: Nov. 17, 2020

(54) AMPLIFICATION APPARATUS

(71) Applicant: TOKYO KEIKI INC., Tokyo (JP)

(72) Inventors: Takayuki Ushikubo, Tokyo (JP); Hiroyuki Tachikawa, Tokyo (JP); Shunichi Hirano, Tokyo (JP)

(73) Assignee: TOKYO KEIKI INC., Tokyo (JP)

( * ) Notice: Subject to any disclaimer, the term of this patent is extended or adjusted under 35 U.S.C. 154(b) by 16 days.

(21) Appl. No.: 16/098,745

(22) PCT Filed: Jun. 13, 2017

(86) PCT No.: PCT/JP2017/021822
§ 371 (c)(1),
(2) Date: Nov. 2, 2018

(87) PCT Pub. No.: WO2017/221768
PCT Pub. Date: Dec. 28, 2017

(65) Prior Publication Data
US 2019/0140604 A1    May 9, 2019

(30) Foreign Application Priority Data

Jun. 24, 2016  (JP) .................................. 2016-125238

(51) Int. Cl.
*H03F 1/30*        (2006.01)
*H03F 3/21*        (2006.01)
(Continued)

(52) U.S. Cl.
CPC .............. *H03F 3/211* (2013.01); *H03F 3/19* (2013.01); *H03F 3/195* (2013.01); *H03F 3/245* (2013.01);
(Continued)

(58) Field of Classification Search
CPC ..................................... H03F 1/30; H03F 3/20
(Continued)

(56) References Cited

U.S. PATENT DOCUMENTS 5,491,454 A * 2/1996 Matz ..................... H03F 1/3229
330/149
6,603,391 B1 * 8/2003 Greeff ................... G01S 13/751
340/10.3
(Continued)

FOREIGN PATENT DOCUMENTS

DE   10 2014 104 364 A1   10/2015
JP       S 57-200937 U     12/1982
(Continued)

OTHER PUBLICATIONS

International Search Report (ISR) (PCT Form PCT/ISA/210), in PCT/JP2017/021822, dated Sep. 5, 2017.

*Primary Examiner* — Henry Choe
(74) *Attorney, Agent, or Firm* — McGinn I.P. Law Group, PLLC.

(57) ABSTRACT

An amplification apparatus includes: at least one voltage converter for converting a voltage of supplied power which is supplied from an external power supply source to the amplification apparatus, to a lower voltage; and at least one amplifier unit operable by supplied power which has the lower voltage as converted by the at least one voltage converter, for amplifying a radio frequency signal.

20 Claims, 2 Drawing Sheets

(51) Int. Cl.
*H03F 3/68* (2006.01)
*H03F 3/24* (2006.01)
*H03F 3/195* (2006.01)
*H03F 3/19* (2006.01)

(52) U.S. Cl.
CPC ......... *H03F 3/68* (2013.01); *H03F 2200/451* (2013.01); *H03F 2203/21106* (2013.01); *H03F 2203/21142* (2013.01)

(58) Field of Classification Search
USPC ..................................... 330/297, 124 R, 295
See application file for complete search history.

(56) References Cited

U.S. PATENT DOCUMENTS

| | | | | |
|---|---|---|---|---|
| 6,985,039 B2* | 1/2006 | Bar-David | ............ | H03F 1/0222 330/135 |
| 8,451,942 B2* | 5/2013 | Otaka | ............ | H03F 1/34 375/219 |
| 8,542,061 B2* | 9/2013 | Levesque | ............ | H03F 1/0227 327/536 |
| 8,669,811 B2* | 3/2014 | Le Gallou | ............ | H03F 1/0227 330/136 |
| 8,884,696 B2* | 11/2014 | Langer | ............ | H03F 1/0244 330/127 |
| 9,225,411 B2* | 12/2015 | Matsuo | ............ | H01Q 3/267 |
| 9,667,198 B2 | 5/2017 | Yoshikawa | | |
| 9,819,311 B2* | 11/2017 | Cohen | ............ | H03F 3/245 |
| 2006/0147062 A1* | 7/2006 | Niwa | ............ | H03F 1/0211 381/113 |
| 2008/0278236 A1 | 11/2008 | Eymor | | |
| 2016/0181985 A1* | 6/2016 | Aoki | ............ | H03F 1/0205 330/124 R |

FOREIGN PATENT DOCUMENTS

| | | |
|---|---|---|
| JP | H 07-212255 A | 8/1995 |
| JP | 2001-177423 A | 6/2001 |
| JP | 2001-185967 A | 7/2001 |
| JP | 2009-536483 A | 10/2009 |
| JP | 2012-199746 A | 10/2012 |
| TW | 201603476 A | 1/2016 |
| WO | WO 2014/155512 A1 | 10/2014 |

\* cited by examiner

[Fig. 1]
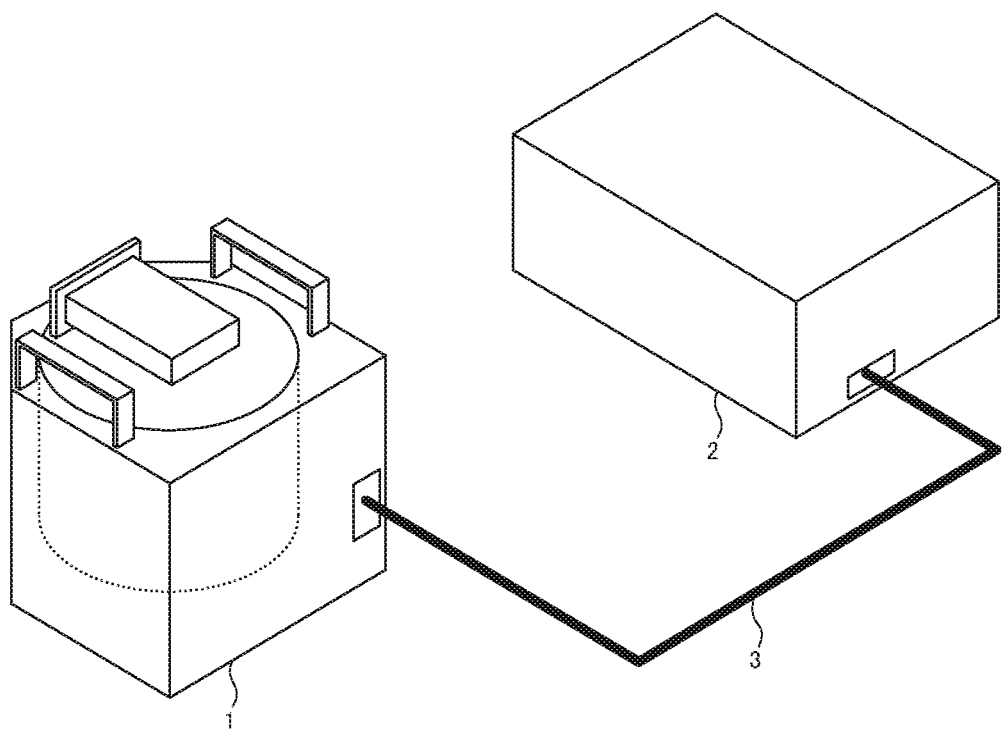
[Fig. 2]
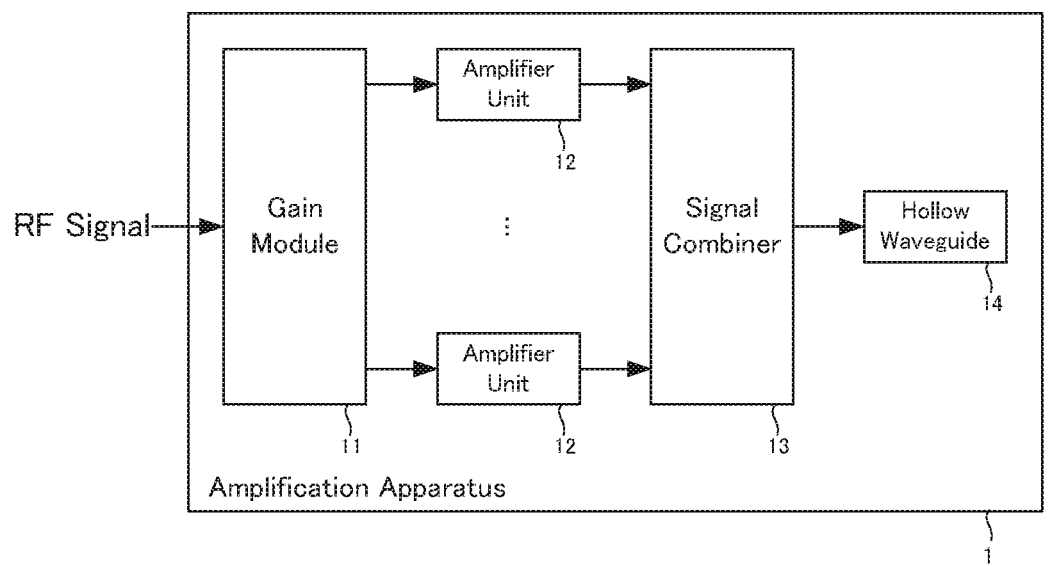

[Fig. 3]
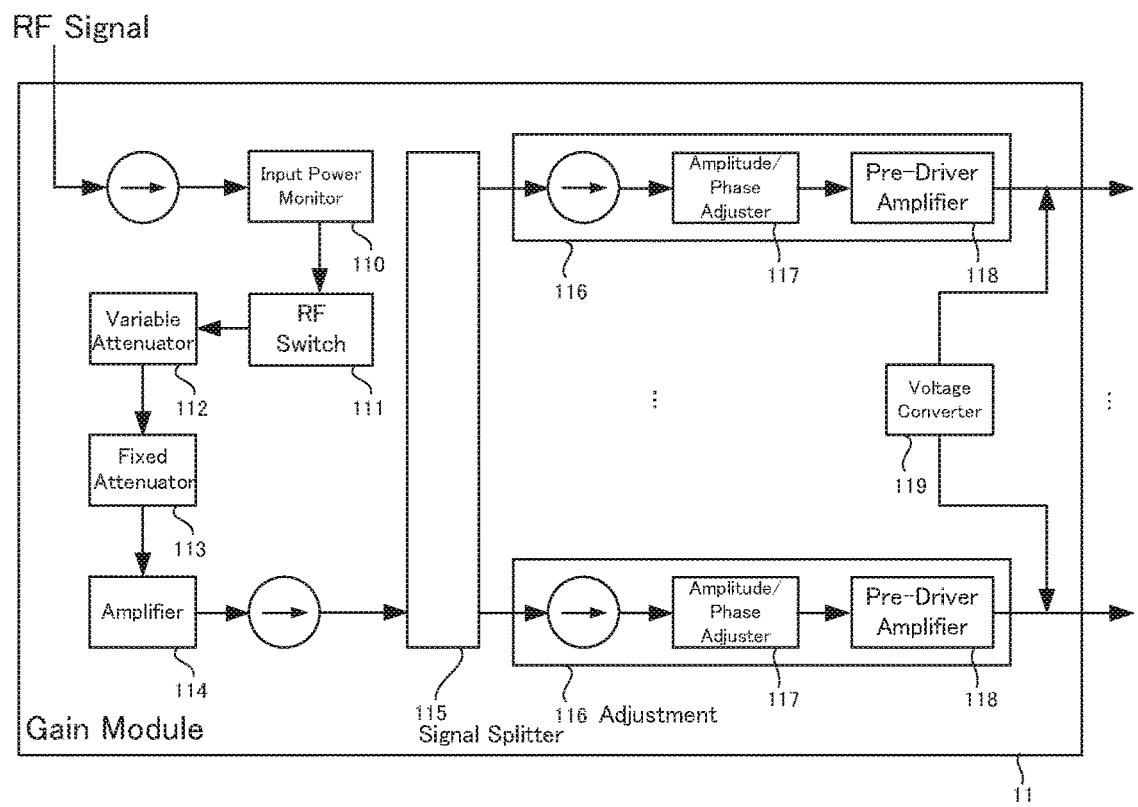
[Fig. 4]
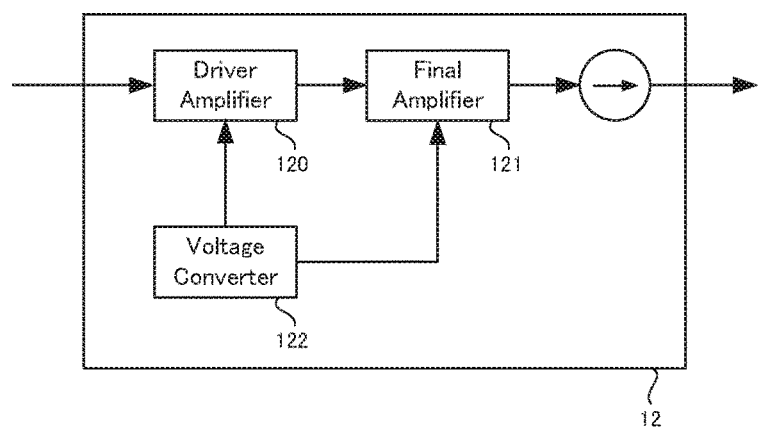

AMPLIFICATION APPARATUS

TECHNICAL FIELD

The present invention relates to a signal amplification technique for amplifying radio frequency (RF) signals.

BACKGROUND OF THE INVENTION

In recent years, there has been an increased expectation of demand for amplification apparatuses which have a solid state power amplifier (SSPA) for providing amplification capability of RF signals, and which may be used in place of magnetron oscillators having a magnetron, which is a widely used oscillator/amplifier element. A typical existing magnetron oscillator is constructed as an apparatus having no onboard power supply unit and being adapted for connection with a separate power supply apparatus through a power supply cable, through which power having a high voltage is supplied to the magnetron oscillator. Under the circumstances, it is desirable that an SSPA based amplification apparatus, which is intended to be used in place of an existing magnetron oscillator, may be constructed as an apparatus which is supplied with power from a separate power supply apparatus.

As a related technique, a semiconductor power amplifier system for powering an element of an antenna is known from Patent Document No. 1 listed below (Japanese Unexamined Patent Application Publication (Translation of PCT Application) No. 2009-536483). The semiconductor power amplifier system includes: an RF amplifier means, having a power output stage; a power supply means for providing a variable value of DC voltage for powering the power output stage; and a control means for receiving as a control input an input power signal of the RF amplifier means, for providing, in response to the control input, a voltage control signal to the power supply means to determine the value of the DC voltage.

PRIOR ART DOCUMENT(S)

Patent Document(s)

Patent Document No. 1: Japanese Unexamined Patent Application Publication (Translation of PCT Application) No. 2009-536483

SUMMARY OF THE INVENTION

Problems to be Solved by the Invention

Unfortunately, a typical operational voltage for magnetrons is as high as about 5 kilovolts, while that for SSPA based amplification apparatuses is as low as about 30 volts. Thus, if the power level of the supplied power to an SSPA based amplification apparatus is alike to that to a magnetron oscillator, the supplied power to the former should have a far lower voltage and a far higher current than that to the latter. This means that the power supply cable for connecting an SSPA based amplification apparatus with a separate power supply apparatus needs to be extremely thick and/or the length of the power supply cable needs to be so limited, which could be substantial restrictions preventing the practical realization of SSPA based amplification apparatuses, and could raise a problem of difficulty in supplying an SSPA based amplification apparatuses with power from a separate power supply apparatus.

The present invention is achieved in order to solve the above mentioned problem. Accordingly, it is an object of the present invention to provide an amplification apparatus, which may be supplied with power from a separate power supply apparatus with more ease.

Resolution

In order to achieve the above object, an amplification apparatus according to the present invention comprises: at least one voltage converter for converting a voltage of supplied power which is supplied from an external power supply source to the amplification apparatus, to a lower voltage; and at least one amplifier unit operable by supplied power which has the lower voltage as converted by the at least one voltage converter, for amplifying a radio frequency signal.

Advantages Provided by the Invention

According to the present invention, there is advantageously provided an amplification apparatus, which may be supplied with power from a separate power supply apparatus with more ease.

BRIEF DESCRIPTION OF THE DRAWINGS

FIG. 1 is a schematic perspective view of an amplification apparatus according to an embodiment of the present invention with a separate power supply apparatus.

FIG. 2 is a high level block diagram of the amplification apparatus.

FIG. 3 is a block diagram of a gain module.

FIG. 4 is a block diagram of an amplifier unit.

EXEMPLARY MODE FOR CARRYING OUT THE INVENTION

Hereinafter, an embodiment of the present invention will be described with reference to the accompanying drawings.

First, an amplification apparatus according to an embodiment of the present invention and a separate power supply apparatus will be described in general. FIG. 1 is a schematic perspective view of the amplification apparatus according to the embodiment of the present invention with the separate power supply apparatus. FIG. 2 is a high level block diagram of the amplification apparatus.

As shown in FIG. 1, the amplification apparatus 1 is connected with the power supply apparatus 2 by means of a power supply cable 3, through which the power supply apparatus 2 supplies the amplification apparatus 1 with power having a relatively high voltage of about 300 volts. The voltage of the power supplied to the amplification apparatus 1 is converted down to a lower voltage of about 30 volts within the amplification apparatus 1.

As shown in FIG. 2, the amplification apparatus 1 includes: i) a gain module 11 for receiving an input RF signal, splitting the received RF signal into a plurality of split RF signals and outputting them; ii) a plurality of amplifier units 12 for receiving the split RF signals, respectively, and amplifying them, respectively; iii) a signal combiner 13 for combining the amplified RF signals, which are amplified by the respective amplifier units 12, into a combined RF signal and outputting it; and (iv) a hollow waveguide 14 for receiving the combined RF signal outputted from the signal combiner 13.

Next, the structures of the gain module and the amplifier unit will be described. FIG. 3 is a block diagram of the gain module. FIG. 4 is a block diagram of the amplifier unit.

As shown in FIG. 3, the gain module 11 includes an input power monitor 110, an RF switch 111, a variable attenuator 112, a fixed attenuator 113, an amplifier 114, a signal splitter 115, a plurality of adjustments 116, and a voltage converter 119.

The input power monitor 110 determines whether or not the power level of an input RF signal received from an external source is appropriate and, if so, outputs the received RF signal to the RF switch 111. The RF switch 111 may be set either "ON" or "OFF" depending on an external control. The RF switch 111 then outputs the received RF signal to the variable attenuator 112 only when it is set "ON". The variable attenuator 112, the attenuation level of which is variable and adjustable, reduces the power level of the received RF signal based on an externally supplied control signal, and outputs the resulting attenuated RF signal to the fixed attenuator 113. The fixed attenuator 113, the attenuation level of which is fixed, reduces the power level of the received RF signal and outputs the resulting attenuated RF signal to the amplifier 114. The amplifier 114 amplifies the received RF signal and outputs the resulting amplified RF signal to the signal splitter 115. The signal splitter 115 splits the received FR signal into a plurality of RF signals and outputs them to the plurality of adjustments 116, respectively.

Each adjustment 116 includes an amplitude/phase adjuster 117 and a pre-driver amplifier 118. Each adjustment 116 serves to adjust the amplitude and the phase of the received RF signal, which is outputted from the signal splitter 115, and further serves to output the resulting adjusted RF signal to the associated one of the amplifier units 12. The amplitude/phase adjuster 117, which may include, for example, a variable attenuator and a phase shifter, adjusts the amplitude and the phase of the received RF signal and outputs the resulting adjusted RF signal to the pre-driver amplifier 118. The pre-driver amplifier 118 amplifies the received RF signal and outputs the resulting amplified RF signal to the associated one of the amplifier units 12. The adjustment levels of the amplitude adjustment and the phase adjustment are settable for each adjustment 116 independently from other adjustments 116, and the setting of the adjustment levels for all the adjustments 116 is achieved, for example, before shipment of the amplification apparatus 1, such that all the RF signals to be outputted from the respective adjustments 116 may have a substantially equal amplitude and may be substantially in phase with one another.

The voltage converter 119 is a DC-to-DC converter serving to convert the voltage of the power, which is supplied from the power supply apparatus 2 through the power supply cable 3, from 300 volts down to 30 volts. The voltage converter 119 further serves to superimpose the resulting DC voltage of 30 volts onto the respective RF signals which are outputted from the adjustments 116 to the associated amplifier units 12.

As shown in FIG. 4, each amplifier unit 12 includes a driver amplifier 120 and a final amplifier 121, each formed as a semiconductor device, and a voltage converter 122. The driver amplifier 120 amplifies the RF signal inputted to and received by the amplifier unit 12 and outputs the resulting amplified RF signal to the final amplifier 121. The final amplifier 121 amplifies the received RF signal, which is outputted from the driver amplifier 120, and outputs the resulting amplified RF signal to the signal combiner 13. The voltage converter 122, like the above mentioned voltage converter 119, is a DC-to-DC converter serving to convert the voltage of the power, which is supplied from the power supply apparatus 2 through the power supply cable 3, from 300 volts down to 30 volts. The voltage converter 122 supplies power having the converted voltage of 30 volts to the driver amplifier 120 and the final amplifier 121. The RF signals outputted from the amplifier units 12 are combined together by the signal combiner 13 and the resulting combined RF signal is outputted to the hollow waveguide 14.

As mentioned above, the power supply apparatus 2 supplies the amplification apparatus 1 with power having a relatively high voltage of about 300 volts and a relatively low current, and the voltage of the supplied power is converted down to a lower voltage of about 30 volts within the amplification apparatus 1, so that the amplification apparatus 1 may be supplied with power from the separate power supply apparatus 2 through the power supply cable 3, which does not need to be so thick nor so short. By virtue of this, an SSPA based amplification apparatus may be constructed with only a little modification to an existing magnetron oscillator, that is, an SSPA may be used with more ease in place of a magnetron.

The above described embodiment of the present invention is for illustrative purpose only and is not intended to limit the scope of the invention. The novel embodiment may be embodied in various other forms, and may be subject to various abbreviations, substitutions and alterations without departing from the spirit of the invention. The above described embodiment and any possible modifications thereof are encompassed within the scope and spirit of the invention, as well as within the scope of the claimed invention and of any equivalents thereof.

LIST OF REFERENCE NUMERALS

1 Amplification apparatus
12 Amplifier unit
13 Signal combiner
115 Signal splitter
119 Voltage converter
122 Voltage converter

What is claimed is:
1. An amplification apparatus, comprising:
at least one voltage converter for converting a voltage of a supplied power, which is supplied from an external power supply source to the amplification apparatus, to a lower voltage;
a plurality of amplifiers operable by the supplied power, which has the lower voltage as converted by the at least one voltage converter, for amplifying a radio frequency signal;
an adjuster provided to correspond to one of the plurality of amplifiers, the adjuster adjusting an amplitude and a phase of the radio frequency signal output to the one of the plurality of amplifiers;
an attenuator for attenuating the radio frequency signal output to the adjuster;
a radio frequency switch configured to be set ON or OFF depending on an external control, the radio frequency switch outputting the radio frequency signal that is received only when the radio frequency switch is set to ON,
wherein the attenuator comprises a variable attenuator for attenuating the radio frequency signal outputted from the radio frequency switch, based on the external control; and a signal splitter for splitting the radio frequency signal that is received from the variable attenuator, and outputting the radio frequency signal that is split to the plurality of amplifiers.

2. The amplification apparatus according to claim 1, wherein the at least one voltage converter is each associated with, and is each provided onboard of, one of the plurality of amplifiers.

3. The amplification apparatus according to claim 1, wherein the at least one voltage converter includes a plurality of voltage converters,
and
wherein one of the plurality of voltage converters superimposes a voltage onto outputs from the signal splitter to the plurality of amplifiers.

4. The amplification apparatus according to claim 3, further comprising:
a signal combiner for combining a plurality of radio frequency signals which are outputted from the plurality of amplifiers, respectively, and outputting resulting combined radio frequency signal.

5. The amplification apparatus according to claim 1, wherein the at least one voltage converter is included in each of the plurality of amplifiers.

6. The amplification apparatus according to claim 1, wherein the at least one voltage converter superimposes the lower voltage to the radio frequency signal that is outputted from the adjuster.

7. The amplification apparatus according to claim 1, wherein the adjuster comprises:
an amplitude and phase adjuster that, prior to the one of the plurality of amplifiers receiving the radio frequency signal, adjusts the amplitude and the phase of the radio frequency signal that the amplitude and phase adjuster sends to the one of the plurality of amplifiers.

8. An amplification apparatus, comprising:
at least one voltage converter for converting a voltage of a supplied power, which is supplied from an external power supply source to the amplification apparatus, to a lower voltage;
at least one amplifier unit operable by the supplied power, which has the lower voltage as converted by the at least one voltage converter, for amplifying a radio frequency signal;
an adjuster provided to correspond to one of the at least one amplifier unit, the adjuster an amplitude and a phase of the radio frequency signal output the one of the at least one amplifier unit; and
an attenuator for attenuating the radio frequency signal output to the adjuster,
wherein the adjuster comprises an amplitude and phase adjuster that, prior to the one of the at least one amplifier unit receiving the radio frequency signal, adjusts the amplitude and the phase of the radio frequency signal that the amplitude and phase adjuster sends to the one of the at least one amplifier unit, and
wherein the at least one voltage converter superimposes the lower voltage to the radio frequency signal that is outputted from the amplitude and phase adjuster.

9. The amplification apparatus according to claim 8, wherein the adjuster further comprises:
a pre-driver amplifier that amplifies the radio frequency signal that is outputted from the amplitude and phase adjuster before the at least one voltage converter superimposes the lower voltage to the radio frequency signal.

10. An amplification apparatus comprising:
at least one voltage converter for converting voltage of a supplied power, which is supplied from an external power supply source to the amplification apparatus, to a lower voltage;
at least one amplifier unit operable by the supplied power, which has the lower voltage as converted by at the at least one voltage converter, for amplifying a radio frequency signal;
an adjuster provided to correspond to one of the at least one amplifier unit, the adjuster adjusting an amplitude and a phase of the radio frequency signal output to the one of the at least one amplifier unit; and
an attenuator for attenuating the radio frequency signal output to the adjuster,
wherein the adjuster comprises:
an amplitude and phase adjuster that, prior to the one of the at least one amplifier unit receiving the radio frequency signal, adjusts the amplitude and the phase of the radio frequency signal that the amplitude and phase adjuster sends to the one of the at least one amplifier unit; and
a pre-driver amplifier that amplifies the radio frequency signal that is outputted from the amplitude and phase adjuster before the at least one voltage converter superimposes the lower voltage to the radio frequency signal.

11. The amplification apparatus according to claim 1, wherein the variable attenuator has an adjustable attenuation level, the variable attenuator reducing a power level of the radio frequency signal based on an externally supplied control signal before the adjuster receives the radio frequency signal.

12. An amplification apparatus, comprising:
at least one voltage converter for converting a voltage of a supplied power, which is supplied from an external power supply source to the amplification apparatus, to a lower voltage;
at least one amplifier unit operable by the supplied power, which has the lower voltage as converted by the at least one voltage converter, for amplifying a radio frequency signal;
an adjuster provided to correspond to one of the at least one amplifier unit, the adjuster adjusting an amplitude and a phase of the radio frequency signal output to the one of the at least one amplifier unit; and
an attenuator for attenuating the radio frequency signal output to the adjuster,
wherein the attenuator comprises a variable attenuator that has an adjustable attenuation level, the variable attenuator reducing a power level of the radio frequency signal based on an externally supplied control signal before the adjuster receives the radio frequency signal, and
wherein the attenuator further comprises a fixed attenuator that has a fixed attenuation level, the fixed attenuator reducing the power level of the radio frequency signal that is outputted from the variable attenuator before the adjuster receives the radio frequency signal.

13. The amplification apparatus according to claim 1, further comprising:
another adjuster provided to correspond to another one of the plurality of amplifiers.

14. An amplification apparatus, comprising:
at least one voltage converter for converting a voltage of a supplied power, which is supplied from an external power supply source to the amplification apparatus to a lower voltage;

at least one amplifier unit operable by the supplied power, which has the lower voltage as converted by the at least one voltage converter, for amplifying a radio frequency signal;

an adjuster provided to correspond to one of the at least one amplifier unit, the adjuster adjusting an amplitude and a phase of the radio frequency signal output to the one of the at least one amplifier unit;

an attenuator for attenuating the radio frequency signal output to the adjuster;

another adjuster provided to correspond to another one of the at least one amplifier unit; and a signal splitter that splits the radio frequency signal that is received from the attenuator and sends the radio frequency signal that is split to the adjuster and to the another adjuster, wherein, before the radio frequency signal is sent to the at least one amplifier, a single voltage converter of the at least one voltage converter superimposes the lower voltage to the radio frequency signal that is outputted from the adjuster and the another adjuster.

15. An amplification apparatus, comprising:
an attenuator for attenuating a radio frequency signal that is provided to the amplification apparatus;
at least one adjuster adjusting an amplitude and a phase of the radio frequency signal outputted from the attenuator;
at least one voltage converters for converting a voltage of an external power supply source to a supplied power to a converted voltage;
plurality of amplifiers provided with the converted voltage to amplify the radio frequency signal that is outputted from the at least one adjuster;
a radio frequency switch configured to be set ON or OFF depending on an external control, the radio frequency switch outputting the radio frequency signal that is received only when the radio frequency switch is set to ON,
wherein the attenuator comprises a variable attenuator for attenuating the radio frequency signal outputted from the radio frequency switch based on the external control; and
a signal splitter for splitting the radio frequency signal that is received from the variable attenuator, and outputting the radio frequency signal that is split to the plurality of amplifiers.

16. The amplification apparatus according to claim 15, wherein the adjuster comprises:
an amplitude and phase adjuster that, prior to the plurality of amplifiers receiving the radio frequency signal, adjusts the amplitude and the phase of the radio frequency signal that the amplitude and phase adjuster sends to the at least one amplifier.

17. The amplification apparatus according to claim 16, wherein the variable attenuator has an adjustable attenuation level, the variable attenuator reducing a power level of the radio frequency signal based on an externally supplied control signal before the adjuster receives the radio frequency signal.

18. An amplification apparatus, comprising:
an attenuator for attenuating a radio frequency signal that is provided to the amplification apparatus;
at least one adjuster adjusting an amplitude and a phase of the radio frequency signal outputted from the attenuator;
at least one voltage converters for converting a voltage of an external power supply source to a supplied power to a converted voltage; and
at least one amplifier provided with the converted voltage to amplify the radio frequency that is outputted from the at least one adjuster,
wherein the adjuster comprises an amplitude and phase adjuster that, prior to the at least one amplifier receiving the radio frequency signal, adjusts the amplitude and the phase of the radio frequency signal that the amplitude and phase adjuster sends to the at least one amplifier,
wherein the attenuator comprises a variable attenuator that has an adjustable attenuation level, the variable attenuator reducing a power level of the radio frequency signal based on an externally supplied control signal before the adjuster receives the radio frequency signal, and
wherein the attenuator further comprises a fixed attenuator that has a fixed attenuation level, the fixed attenuator reducing the power level of the radio frequency signal that is outputted from the variable attenuator before the adjuster receives the radio frequency signal.

19. The amplification apparatus according to claim 15, wherein the at least one adjuster comprises a first adjuster and a second adjustor
wherein the signal splitter sends the radio frequency signal that is split to the first adjuster and the second adjuster.

20. An amplification apparatus comprising:
an attenuator for attenuating a radio frequency signal that is provided to the amplification apparatus;
at least one adjuster adjusting an amplitude and a phase of the radio frequency signal outputted from fire attenuator;
at least one voltage converters for converting a voltage of an external power supply source to a supplied power to a converted voltage; and
at least one amplifier provided with the converted voltage to amplify the radio frequency signal that is outputted from the at least one adjuster,
wherein the at least one adjuster comprises a first adjuster and a second adjustor,
wherein the amplification apparatus further comprises a signal splitter that splits the radio frequency signal that is received from the attenuator and sends the radio frequency signal that is split to the first adjuster and the second adjuster, and
wherein, before the radio frequency signal is sent to the at least one amplifier, a single voltage converter of the at least one voltage converter superimposes the converted voltage to the radio frequency signal that is outputted from the first adjuster and the second adjuster.

* * * * *